(12) United States Patent
Nayfeh et al.

(10) Patent No.: US 9,455,391 B1
(45) Date of Patent: Sep. 27, 2016

(54) ADVANCED PROCESS FLOW FOR QUANTUM MEMORY DEVICES AND JOSEPHSON JUNCTIONS WITH HETEROGENEOUS INTEGRATION

(71) Applicant: SPAWAR Systems Center Pacific, San Diego, CA (US)

(72) Inventors: Osama M. Nayfeh, San Diego, CA (US); Son Dinh, San Diego, CA (US); Anna Leese de Escobar, San Diego, CA (US); Kenneth Simonsen, San Diego, CA (US)

(73) Assignee: The United States of America as represented by Secretary of the Navy, Washington, DC (US)

( * ) Notice: Subject to any disclaimer, the term of this patent is extended or adjusted under 35 U.S.C. 154(b) by 0 days.

(21) Appl. No.: 15/060,353

(22) Filed: Mar. 3, 2016

(51) Int. Cl.
| | |
|---|---|
| H01L 21/8239 | (2006.01) |
| H01L 39/22 | (2006.01) |
| H01L 27/18 | (2006.01) |
| H01L 39/24 | (2006.01) |

(52) U.S. Cl.
CPC ............ *H01L 39/223* (2013.01); *H01L 27/18* (2013.01); *H01L 39/2493* (2013.01)

(58) Field of Classification Search
CPC .................... H01L 27/1052; H01L 27/10844; H01L 27/11; H01L 27/115
See application file for complete search history.

(56) References Cited

U.S. PATENT DOCUMENTS

| | | |
|---|---|---|
| 7,135,701 B2 | 11/2006 | Amin et al. |
| 2011/0089405 A1* | 4/2011 | Ladizinsky ............ B82Y 10/00 257/31 |

OTHER PUBLICATIONS

Du, J. et al., "Fabrication and Characterisation of Series YBCO Step-Edge Josephson Junction Arrays", Superconducting Science and Technology, IOP Publishing, vol. 27, pp. 1-7, 2014.
Tolpygo, S, et al., "Fabrication—process-induced variations of NB/Al/AlOx/Nb Josephson junctions in superconductor integrated circuits", Superconductor Science and Technology, IOP Publishing, vol. 24, pp. 1-9, 2010.
Stewart, W.C., "Current-Voltage Characteristics of Josephson Junctions", Applied Physics Letters, vol. 12, No. 8, pp. 277-280, Apr. 1968.
Gheewala, Tushar, "The Josephson Technology", Proceedings of the IEEE, vol. 70, No. 1, pp. 26-34, Jan. 1982.

(Continued)

*Primary Examiner* — Mohammad Choudhry
(74) *Attorney, Agent, or Firm* — SPAWAR Systems Center Pacific; Kyle Eppele; J. Eric Anderson

(57) ABSTRACT

A process for constructing a superconducting Josephson-based nonvolatile quantum memory device comprising: sequentially depositing on a silicon substrate a thermal oxide buffer layer, a superconductor bottom-electrode thin film, and an oxide isolation layer; patterning an active window having dimensions smaller that 10 nanometers in the oxide isolation layer; then sequentially depositing a bottom tunnel oxide layer, a charge-trapping layer, a top cap, and a top superconductor electrode layer; defining an active region by dry etching down to the oxide isolation layer while protecting the active region from etch chemistry; depositing a device passivation layer; defining and patterning vias from a top of the device passivation layer to the superconductor bottom-electrode thin film and to the top superconductor electrode of the active region; and depositing metal interconnect into the vias.

14 Claims, 5 Drawing Sheets

(56) References Cited

OTHER PUBLICATIONS

Clement, P.-Y. et al., "Double barrier magnetic tunnel junctions with write/read mode select layer", 2014 IEEE 6th International Memory Workshop, Tapei, Taiwan, pp. 1-4, May 18-21, 2014.
Baek, B. et al., "Magnetic barrier structures for superconducting-magnetic hybrid Josephson junctions", 2013 IEEE 14th International Superconductive Electronics Conference, Cambridge, MA, pp. 1-3, Jul. 7-11, 2013.
Holmes, D.S. et al., "Energy-Efficient Superconducting Computing—Power Budgets and Requirements," IEEE Transactions on Applied Superconductivity, vol. 23, No. 3, Jun. 2013.
Harris, R. et. al, "Experimental investigation of an eight-qubit unit cell in a superconducting optimization processor," Phys. Rev. B, vol. 82, 024511, 2010.
Mukhanov, O. A., "Energy-efficient Single Flux Quantum technology," IEEE Trans. Appl. Supercond., Jun. 21, 2011.
Nayfeh, O.M. et. al "Memory effects in metal-oxide-semiconductor capacitors incorporating dispensed highly monodisperse 1 nm silicon nanoparticles," Applied Physics Letters, vol. 90, No. 15, Apr. 2007.
Berggren, S. et. al, "Development of 2-D Bi-SQUID Arrays with High Linearity," IEEE Transactions on Applied Superconductivity, vol. 23, No. 3, Jun. 2013.
Mitchell, E.E. et al., "YBCO step-edge junctions with high IcRn, Superconductor Science and Technology, vol. 23, 2010, 065007.
Akaike, H., "Characterization of NbN Tunnel Junctions with Radical-Nitrided AlNx Barriers," IEEE Transactions on Applied Superconductivity, vol. 23, No. 3, Jun. 2013.
Satoh, K. et al., "Fabrication Process of Planarized Multi-Layer Nb Integrated Circuits," IEEE Transactions on Applied Superconductivity, vol. 15, No. 2, Jun. 2005.
Kerber, G. et al., "Fabrication of High Current Density Nb Integrated Circuits Using a Self-Aligned Junction Anodization Process," IEEE Transactions on Applied Superconductivity, vol. 13, No. 2, Jun. 2003.
Meckbach, J.M. et al., "Sub-um Josephson Junctions for Superconducting Quantum Devices," IEEE Transactions on Applied Superconductivity, vol. 23, No. 3, Jun. 2013.
Chen, K. et al., "High-Jc MgB2 Josephson junctions with operating temperature up to 40K," Applied Physics Letters, vol. 96, 042506, 2010.
Seto, J. et al., "Supercurrent Tunneling Junctions and Tellurium Barriers," Applied Physics Letters, vol. 19, No. 11, pp. 488-491, Dec. 1971.
Kuprianov, M.Y., et al., "Influence of boundary transparency on the critical current of 'dirty' SS'S structures," Sov. Phys. JETP,vol. 67, No. 6, pp. 1163-1168, Jun. 1988.
Strukov, D.B. et al., "Exponential ionic drift: fast switching and low volatility of thin film memristors," Appl Phys A, vol. 94, pp. 515-519, 2009.
Rose-Innes, A.C. et al., "Superconductivity of Superimposed Metals," Phys. Rev. Lett. Vo. 7, No. 7, 278-279 (1961).
Kleinasser, A.W. et al., "Semiconductor Heterostructure Weak Links for Josephson and Superconducting FET Applications," IEEE Transactions on Magnetics, vol. Mag-23, No. 2, Mar. 1987.
De Escobar, A.L. et al., "High Performance HF-VHF All Digital RF Receiver Tested at 20 GHz Clock Frequencies" Military Communications Conference, 2006. MILCOM 2006, IEEE; Oct. 23-25, 2006.
USPTO; Office Action regarding related U.S. Appl. No. 14/716,629.

\* cited by examiner

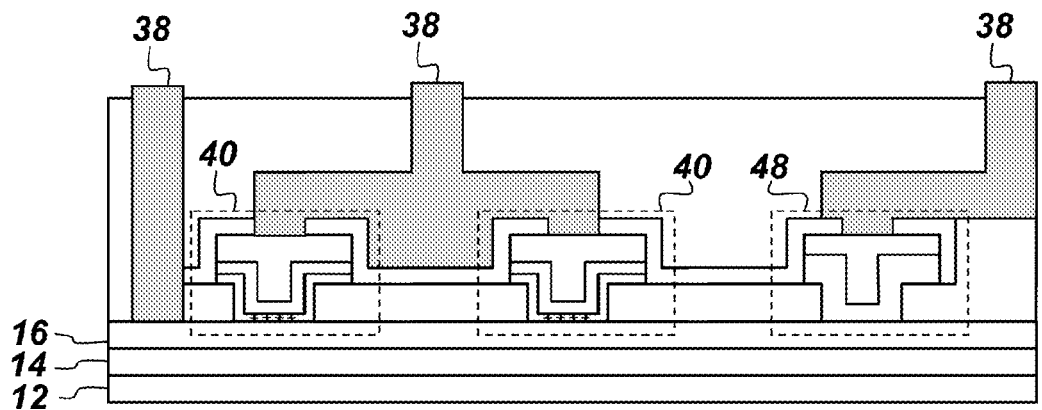
Fig. 5A
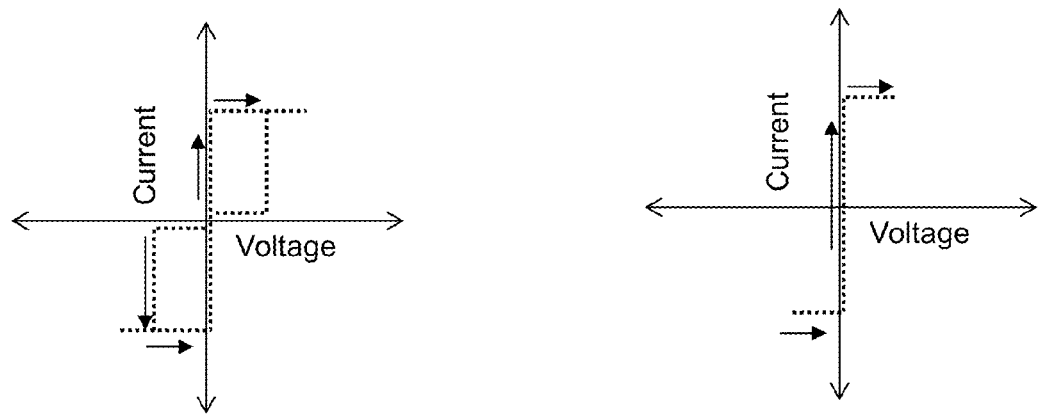
Fig. 5B  Fig. 5C

ADVANCED PROCESS FLOW FOR QUANTUM MEMORY DEVICES AND JOSEPHSON JUNCTIONS WITH HETEROGENEOUS INTEGRATION

FEDERALLY-SPONSORED RESEARCH AND DEVELOPMENT

The United States Government has ownership rights in this invention. Licensing and technical inquiries may be directed to the Office of Research and Technical Applications, Space and Naval Warfare Systems Center, Pacific, Code 72120, San Diego, Calif., 92152; voice (619) 553-5118; ssc_pac_t2@navy.mil. Reference Navy Case Number 102933.

CROSS-REFERENCE TO RELATED APPLICATION

This application is related to U.S. application Ser. No. 14/716,629, filed 19 May 2015, titled "Quantum Memory Device and Method" (Navy Case #102361), which application is hereby incorporated by reference herein in its entirety for its teachings. This application is also related to U.S. application Ser. No. 15/060,290, filed 3 Mar. 2016, titled "Reconfigurable, Tunable Quantum Qubit Circuits with Internal, Nonvolatile Memory" (Navy Case #102561), which application is hereby incorporated by reference herein in its entirety for its teachings.

BACKGROUND OF THE INVENTION

The invention claimed herein relates to the field of Josephson junction fabrication processes. Current existing processes for construction of Josephson junctions typically utilize an anodic anodization process to achieve device passivation/isolation. Unfortunately, anodization results in consumption of ~60-80 nm of the superconductor film (e.g. Nb) and can cause degradation of the active tunneling barrier films and interfaces, therefore limiting the minimum device area, final achievable circuit density, and overall circuit reliability.

SUMMARY

Disclosed herein is a process for constructing a superconducting Josephson-based nonvolatile quantum memory device. An embodiment of the process comprises the following steps. The first step involves providing a silicon substrate. The next step provides for depositing a thermal oxide buffer layer on the substrate. The next step provides for depositing a superconductor bottom-electrode thin film on the thermal oxide buffer layer. The next step provides for depositing an oxide isolation layer by low-pressure chemical vapor deposition (LPCVD) on the superconductor bottom-electrode thin film. The next step provides for patterning an active window having dimensions smaller that 10 nanometers (nm) in the oxide isolation layer. The next step provides for depositing a bottom tunnel oxide layer on the oxide isolation layer and the active window via thermal atomic layer deposition (ALD). The next step provides for depositing a charge-trapping layer via plasma-enhanced ALD on the bottom tunnel oxide layer. The next step provides for depositing a top cap via thermal ALD on the charge-trapping layer. The next step provides for depositing a top superconductor electrode layer having a thickness greater than 50 nm. This may be accomplished via sputtering. The next step provides for defining an active region by dry etching down to the oxide isolation layer while protecting the active region from etch chemistry. Step The next step provides for cleaning the substrate and depositing a device passivation/isolation layer having a thickness of approximately 5-15 nm on the oxide isolation layer and the active region via conformal ALD. The next step provides for defining and patterning vias from a top of the device passivation/isolation layer to the superconductor bottom-electrode thin film and to the top superconductor electrode of the active region. The next step provides for depositing metal interconnect into the vias.

BRIEF DESCRIPTION OF THE DRAWINGS

Throughout the several views, like elements are referenced using like references. The elements in the figures are not drawn to scale and some dimensions are exaggerated for clarity.

FIG. 5A is a side-view illustration of a conventional Josephson junction integrated heterogeneously with, and in close proximity to, superconducting Josephson-based nonvolatile quantum memory devices.

FIG. 5B is a graph showing current and voltage characteristics of a quantum memory device.

FIG. 5C is a graph showing current and voltage characteristics of a conventional Josephson junction.

DETAILED DESCRIPTION OF EMBODIMENTS

The disclosed methods and systems below may be described generally, as well as in terms of specific examples and/or specific embodiments. For instances where references are made to detailed examples and/or embodiments, it should be appreciated that any of the underlying principles described are not to be limited to a single embodiment, but may be expanded for use with any of the other methods and systems described herein as will be understood by one of ordinary skill in the art unless otherwise stated specifically.

Figure 1:
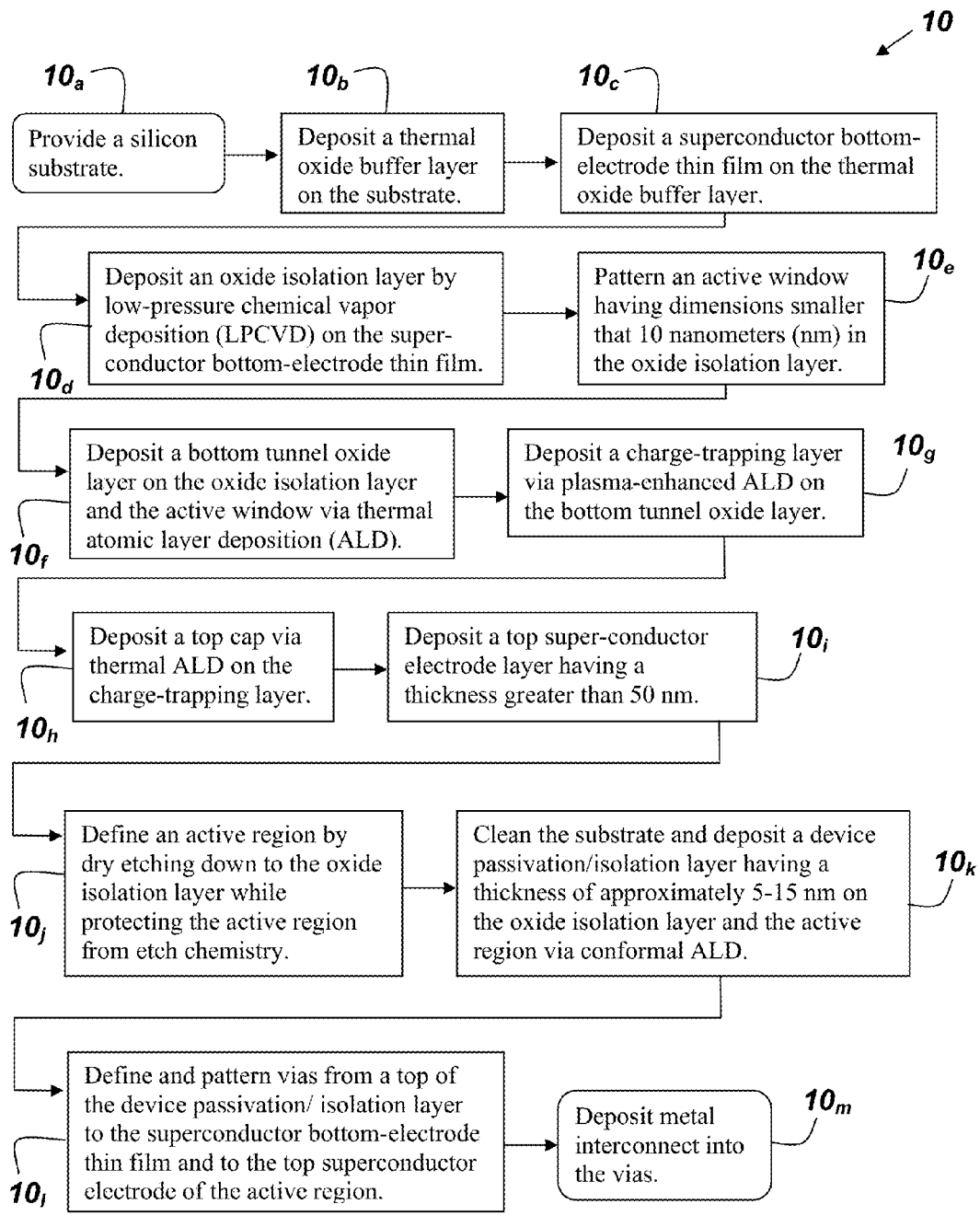
FIG. 1 is a flowchart.

FIG. 1 is a flowchart of an embodiment of a process 10 for constructing a superconducting Josephson-based nonvolatile quantum memory device. Process 10 comprises, consists of, or consists essentially of the following steps. Step 10$_a$ involves providing a silicon substrate. Step 10$_b$ provides for depositing a thermal oxide buffer layer on the substrate. Step 10$_c$ provides for depositing a superconductor bottom-electrode thin film on the thermal oxide buffer layer. Step 10$_d$ provides for depositing an oxide isolation layer by low-pressure chemical vapor deposition (LPCVD) on the superconductor bottom-electrode thin film. Step 10$_e$ provides for patterning an active window having dimensions smaller that 10 nanometers (nm) in the oxide isolation layer. Step 10$_f$ provides for depositing a bottom tunnel oxide layer on the oxide isolation layer and the active window via thermal atomic layer deposition (ALD). Step 10$_g$ provides for depositing a charge-trapping layer via plasma-enhanced ALD on the bottom tunnel oxide layer. Step 10$_h$ provides for depositing a top cap via thermal ALD on the charge-trapping layer. Step 10$_i$ provides for depositing a top superconductor electrode layer having a thickness greater than 50 nm. This may be accomplished via sputtering. Step 10$_j$ provides for defining an active region by dry etching down to the oxide isolation layer while protecting the active region from etch chemistry. Step $10_k$ provides for cleaning the substrate and depositing a device passivation/isolation layer having a thickness of approximately 5-15 nm on the oxide isolation layer and the active region via conformal ALD. Step $10_l$ provides for defining and patterning vias from a top of the device passivation/isolation layer to the superconductor bottom-electrode thin film and to the top superconductor electrode of the active region. Step $10_m$ provides for depositing metal interconnect into the vias.

Figure 2:
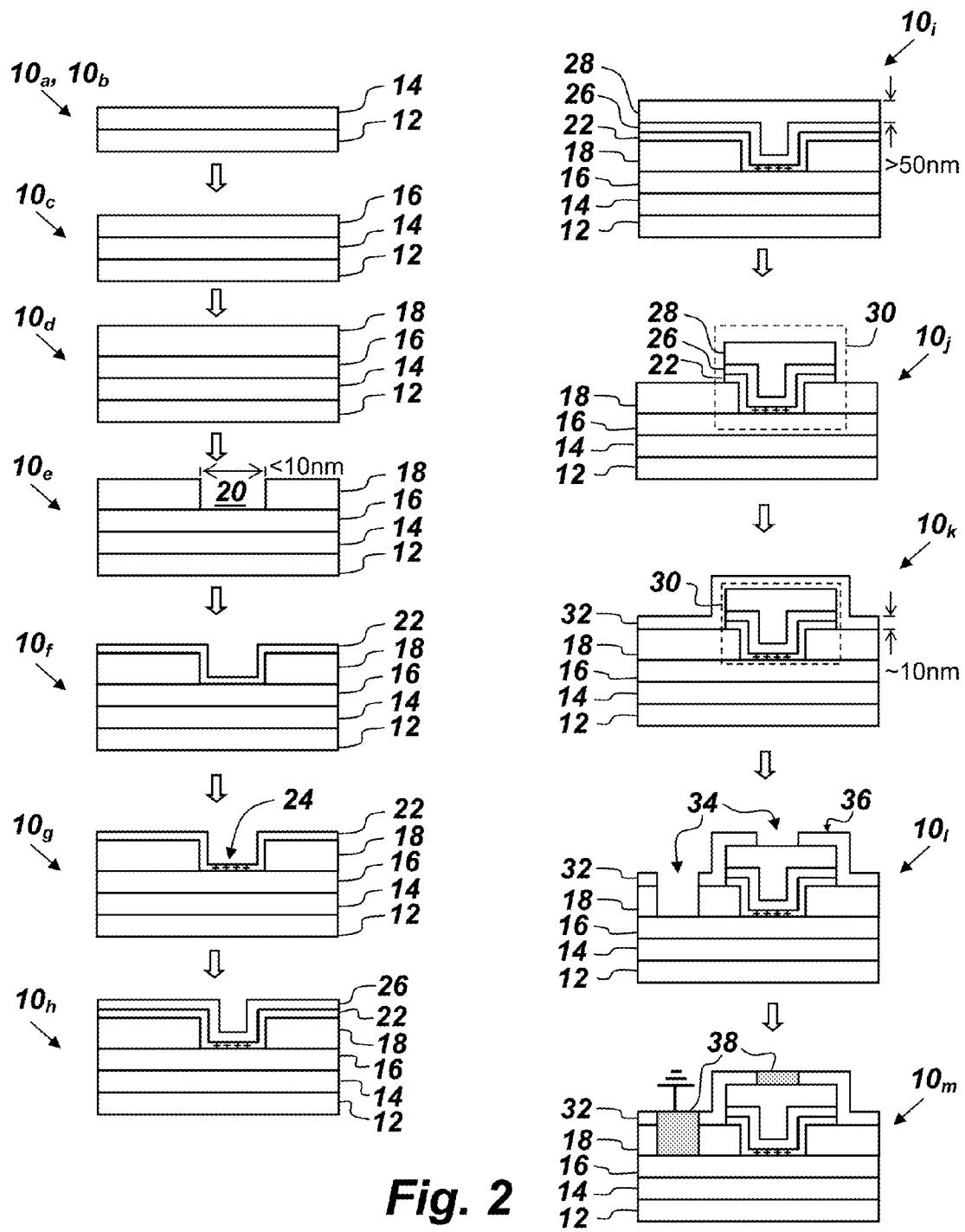
FIG. 2 is a series of illustrations depicting process steps.

FIG. 2 is a series of illustrations depicting the exemplary process steps shown in FIG. 1. In steps $10_a$ and $10_b$ a thermal oxide buffer layer 14 is deposited on the substrate 12. A suitable, non-limiting example of the thermal oxide buffer layer 14 is silicon dioxide ($SiO_2$). A suitable, non-limiting example of the substrate 12 is a silicon handle wafer. In step $10_c$, a superconductor bottom-electrode thin film 16 on the thermal oxide buffer layer 14. A suitable, non-limiting example of material from which the superconductor bottom-electrode thin film 16 may be constructed is Niobium (Nb). In step $10_d$, an oxide isolation layer 18 is deposited by low-pressure chemical vapor deposition (LPCVD) on the superconductor bottom-electrode thin film 16. Suitable examples of the oxide isolation layer 18 include, but are not limited to aluminum oxide, silicon dioxide, sapphire, hafnium dioxide, silicon carbide, diamond, superconductors, silicon, semiconductors, and metallic and oxide superconductors. In step $10_e$, an active window 20 having dimensions smaller that 10 nanometers (nm) is patterned in the oxide isolation layer 18. In step $10_f$, a bottom tunnel oxide layer 22 is deposited on the oxide isolation layer 18 and the active window 20 via thermal atomic layer deposition (ALD). Suitable, non-limiting examples of materials of which the bottom tunnel oxide layer 22 may be fabricated include $SiO_2$, aluminum oxide, silicon carbide, diamond, materials with topological properties, bismuth, thin metals, tungsten, and aluminum. In step $10_g$, a charge-trapping layer 24 is deposited via plasma-enhanced ALD on the bottom tunnel oxide layer 22. In step $10_h$, a top cap 26 is deposited via thermal ALD on the charge-trapping layer 24. In step $10_i$, a top superconductor electrode layer 28 having a thickness greater than 50 nm is deposited on the top cap 26. In a non-limiting example, the top superconductor electrode layer 28 may be a layer of Nb. Step $10_j$ provides for defining an active region 30 by dry etching down to the oxide isolation layer 18 while protecting the active region 30 from etch chemistry. In step $10_k$, the substrate 12 is cleaned and a device passivation/isolation layer 32 having a thickness of approximately 5-15 nm is deposited on the oxide isolation layer 18 and the active region 30 via conformal ALD. In step $10_l$, vias 34 are defined and patterned from a top 36 of the device passivation/isolation layer 32 to the superconductor bottom-electrode thin film 16 and to the top superconductor electrode 28 of the active region 30. In step $10_m$, metal interconnects 38 are deposited into the vias 34. The metal interconnect may be any conductive material capable of being deposited into the vias 34. Suitable examples of the metal interconnect 38 include, but are not limited to Nb, gold (Au), titanium (Ti), palladium (Pd), and aluminum (Al).

Process 10 is an advanced process for constructing superconducting Josephson-based nonvolatile quantum memory devices. The process 10 constructs an active film stack that provides the memory effect and well passivation/isolation. Process 10 is amenable to high density three-dimensional heterogeneous integration with on-chip Josephson Junctions. Devices constructed based on process 10 can be utilized for high performance rapid single flux quantum (RSFQ) Josephson junction superconducting computer logic circuitry or as the building block of qubits. Process 10 does not rely exclusively on the use of sputtered/evaporated films that require subsequent uncontrolled exposure to ambient to produce the tunneling barrier.

The superconductor bottom-electrode thin film 16 may be deposited by sputtering, pulsed-laser-deposition (PLD) or atomic layer deposition (ALD). The oxide isolation layer 18 may be deposited by LPCVD. Suitable ways of patterning the active window 20 include, but are not limited to, e-beam lithography and etching by wet or dry etching. In a non-limiting example embodiment, the bottom tunnel oxide layer 22 may consist of 3-5 monolayers of hafnium oxide ($HfO_2$) or aluminum oxide ($Al_2O_3$). In a non-limiting example embodiment, the charge-trapping layer 24 may consist of 1-2 monolayers of $HfO_x$ or $AlO_x$. In a non-limiting example embodiment, the top cap 26 may consist of 3-5 monolayers of $HfO_2/Al_2O_3$ and/or ferro-electric material optionally followed by >20 monolayers of superconductor such as niobium silicon (NbSi). The thermal oxide buffer layer 14, the superconductor bottom electrode thin film 16, the oxide isolation layer 18, the bottom tunnel oxide layer 22, the charge-trapping layer 24, and the top cap 26 may be formed in-situ by alternating between thermal/plasma-enhanced/thermal ALD. ALD provides for conformal coverage in the well. Following ALD, the top superconductor electrode 28 may be deposited by sputtering. In a non-limiting example embodiment, the device passivation/isolation layer 32 may be deposited via conformal ALD. The metal interconnect 38 may be resistive or superconductive and may be used to connect to high density planar devices.

Figure 3:
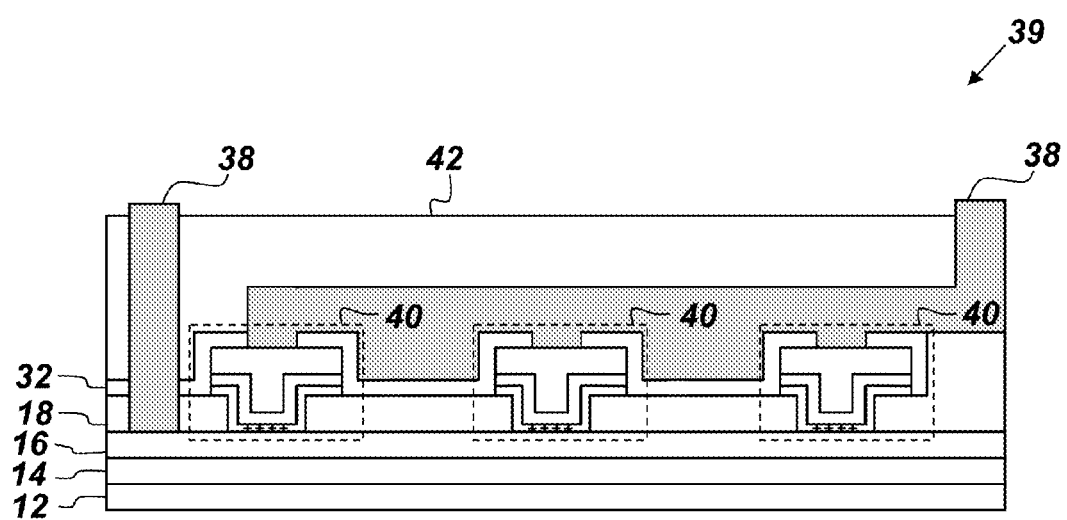
FIG. 3 is a side-view illustration of a lateral array of superconducting Josephson-based nonvolatile quantum memory devices.
Figure 4:
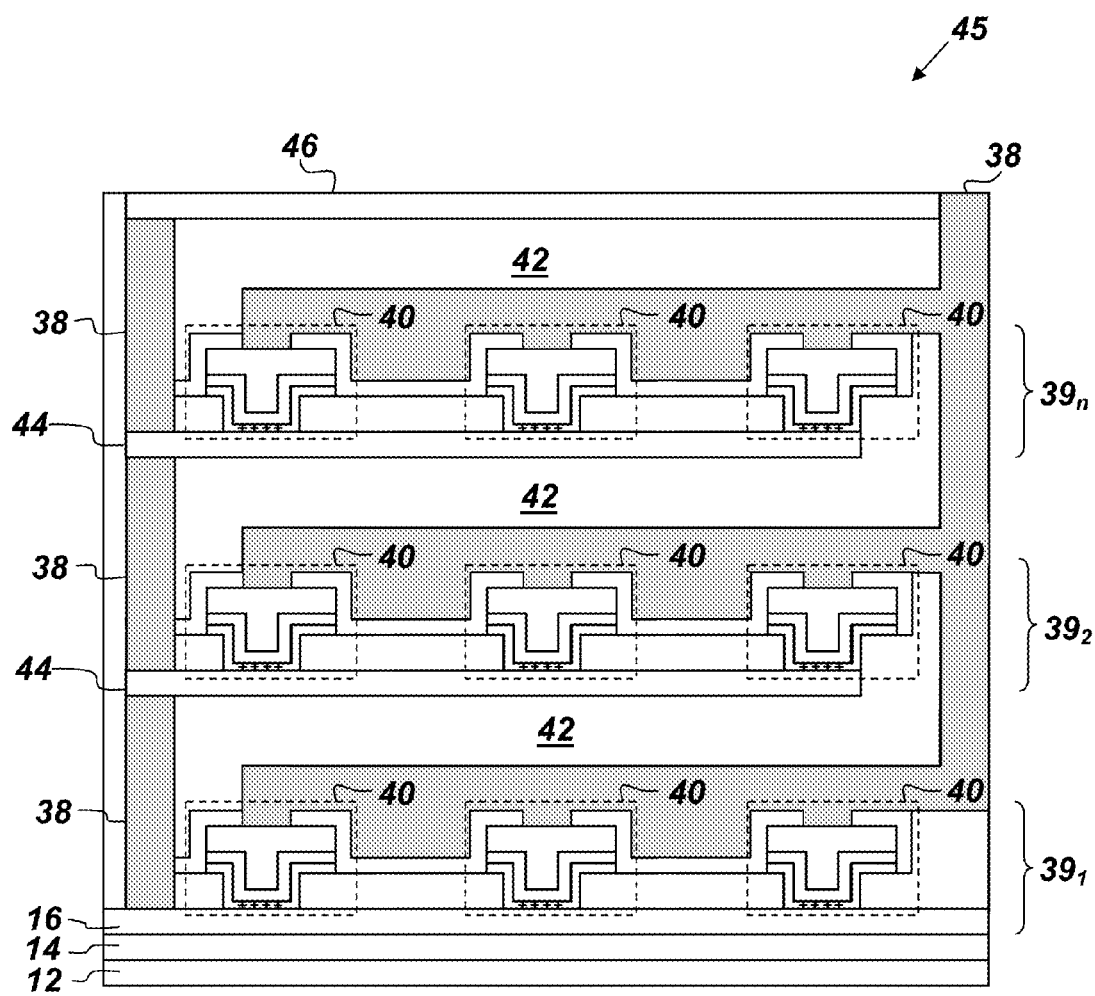
FIG. 4 is a side-view illustration of an embodiment of a three-dimensional array of quantum memory devices.

FIG. 3 is a side-view illustration of a lateral array 39 of superconducting Josephson-based nonvolatile quantum memory devices 40 constructed according to process 10. The active regions 30 of the quantum memory devices 40 are interconnected via the metal interconnect 38. An additional oxide isolation layer 42 may be added to the lateral array of quantum memory devices 40 to allow construction of additional, interconnected lateral arrays 39 to form a three-dimensional (i.e., lateral and vertical) array of quantum memory devices 40, such as is depicted in FIG. 4. The additional oxide isolation layer 42 may be made of $SiO_2$ and may be approximately 50-100 nm thick.

FIG. 4 is a side-view illustration of an embodiment of a three-dimensional (3D) array 45 of quantum memory devices 40 fabricated according to the steps of process 10. In this embodiment, the lateral arrays $39_1$-$39_n$ are separated from each other by additional oxide isolation layers 42 and by additional superconductor bottom electrodes 44. The 3D array 45 may comprise any desired number of stacked lateral arrays 39. The additional superconductor bottom electrodes 44 may be made of Nb and may be deposited by sputtering, PLD, or ALD. A metal-interconnect-filled via may be placed between the superconductor bottom electrodes 36 of the lateral arrays 39. Conventional planarization may be utilized to smooth interlayer dielectrics between layers. In addition, process 10 can be utilized to produce conventional Josephson Junctions with excellent isolation and passivation properties. The 3D array 45 of quantum memory devices 40 may optionally be capped with a top element 46. Suitable examples of the top element 46 include, but are not limited to, a topological insulator film if hybrid superconductor/topological effects are needed for majorana processing, and an encapsulation film, if required for protection.

FIG. 5A is a side-view illustration of a conventional Josephson junction 48 integrated heterogeneously with, and in close proximity to, the superconducting Josephson-based nonvolatile quantum memory devices 40. FIG. 5B is a graph showing the current and voltage characteristics of the quantum memory devices 40. FIG. 5C is a graph showing the current and voltage characteristics of the close-proximity-integrated Josephson junction 48. As used herein, the term "close proximity" is understood to mean that the distance D between the Josephson junction 48 and the superconducting Josephson-based nonvolatile quantum memory devices 40 is equal to or less than the quantum coherence length for which coupling can occur and such that there is no break in a crystal lattice between the Josephson junction 48 and the superconducting Josephson-based nonvolatile quantum memory devices 40. This could mean that the sculpted active window 20 region corresponding to the Josephson junction 48 is directly in contact and seamlessly transitions without break in the crystals lattice or in proximity with a break in crystal lattice but close enough where the quantum wavefunctions overlap (i.e. at or less than the quantum coherence length for which coupling can occur).

Table 1 outlines the process steps of an embodiment of process 10. It is to be understood that process 10 is not limited to the process steps outlined in Table 1. Table one is offered to illustrate one example of process 10 that incorporates ALD processes to construct Nb-based quantum memory devices.

TABLE 1

| Process Step# | Description | Tool | Process notes |
|---|---|---|---|
| 1 | Starting substrates (Si wafers with 300 nm thermal SiO$_2$) | Vendor supplied | University wafer ( 4: ") |
| 2 | Ti/Au/Nb (Superconductor) deposition | Denton discovery | Ti: RF sputter at 200 W (6 minutes) ~12 nm from dektak<br>Au: DC sputter at 300 W (6 minutes) ~200 nm<br>Nb: DC sputter at 300 W (6 minutes)~100 nm |
| 3 | Barrier/Ionic/Barrier deposition | Beneq Atomic Layer Deposition | AlO$_x$: 20 cycles TMA+H$_2$O at ~1 angstrom per cycle<br>HfO$_x$: TDMAH + H$_2$O 20 cycles at ~1 angstrom per cycle<br>AlO$_x$: 20 cycles at ~1 angstrom per cycle |
| 4 | Top Nb superconductor electrode deposition | Denton discovery | Nb: DC sputter at 300 W (11 minutes) ~250 nm |
| 5 | Photolithography (top electrode) | MA6 | PR 1-1000 resist RD-6 developer (~40 s) |
| 6 | Reactive Ion Etch (RIE) | Oxford Plasma Lab | SF6 for |
| 7 | Passivation/isolation oxide deposition | Oxford Plasma deposition | Silane and N$_2$O (7 minutes ~500 nm) |
| 8 | Photolithography (contact) | MA6 | PR 1-1000 resist |
| 9 | Contact etch | Oxford Plasma Lab SiO$_2$ etch | CF$_4$/O$_2$ |

From the above description of the process 10 for constructing a superconducting Josephson-based nonvolatile quantum memory device, it is manifest that various techniques may be used for implementing the concepts of process 10 without departing from the scope of the claims. The described embodiments are to be considered in all respects as illustrative and not restrictive. The method/apparatus disclosed herein may be practiced in the absence of any element that is not specifically claimed and/or disclosed herein. It should also be understood that process 10 is not limited to the particular embodiments described herein, but is capable of many embodiments without departing from the scope of the claims.

We claim:

1. A process for constructing a superconducting Josephson-based nonvolatile quantum memory device comprising:
   providing a silicon substrate;
   depositing a thermal oxide buffer layer on the substrate;
   depositing a superconductor bottom-electrode thin film on the thermal oxide buffer layer;
   depositing an oxide isolation layer by low-pressure chemical vapor deposition (LPCVD) on the superconductor bottom-electrode thin film;
   patterning an active window having dimensions smaller that 10 nanometers in the oxide isolation layer;
   depositing a bottom tunnel oxide layer on the oxide isolation layer and the active window via thermal atomic layer deposition (ALD);
   depositing a charge-trapping layer via plasma-enhanced ALD on the bottom tunnel oxide layer;
   depositing a top cap via thermal ALD on the charge-trapping layer;
   depositing a top superconductor electrode layer having a thickness greater than 50 nanometers;
   defining an active region by dry etching down to the oxide isolation layer while protecting the active region from etch chemistry;
   cleaning the substrate and depositing a device passivation/isolation layer having a thickness of approximately 5-15 nanometers on the oxide isolation layer and the active region via conformal ALD;
   defining and patterning vias from a top of the device passivation/isolation layer to the superconductor bottom-electrode thin film and to the top superconductor electrode of the active region; and
   depositing metal interconnect into the vias.

2. The process of claim 1, wherein the process of depositing the thermal oxide buffer layer is selected from the group consisting of sputtering, pulsed-laser-deposition (PLD), and ALD.

3. The process of claim 2, wherein the process of depositing the superconductor bottom-electrode thin film is selected from the group consisting of sputtering, PLD, and ALD.

4. The process of claim 1, wherein the patterning step is accomplished via a process selected from the group consisting of e-beam lithography, wet etching, and dry etching.

5. The process of claim 1, wherein the superconducting Josephson-based nonvolatile quantum memory device is constructed without the use of anodic anodization.

6. The process of claim 1, wherein the metal interconnect is resistive.

7. The process of claim 1, wherein the metal interconnect is superconductive.

8. The process of claim 1, further comprising repeating the steps of claim 1 to construct a first layer comprising a plurality of superconducting Josephson-based nonvolatile quantum memory devices on the substrate.

9. The process of claim 8, further comprising the steps of:
   depositing a second oxide isolation layer having a thickness of approximately 50-100 nanometers on the first layer of superconducting Josephson-based nonvolatile quantum memory devices; and
   depositing a second bottom superconductor electrode on the second oxide isolation layer; and repeating the steps of claim 8 to construct a second layer comprising a plurality of superconducting Josephson-based nonvolatile quantum memory devices on top of the first layer, wherein the superconductor bottom-electrode thin films of each layer are electrically connected.

10. The process of claim 9, further comprising the step of heterogeneously integrating Josephson Junctions with the superconducting Josephson-based nonvolatile quantum memory devices on the substrate.

11. The process of claim 9, further comprising the step of utilizing planarization to smooth interlayer dielectrics between layers.

12. The process of claim 9, wherein the superconductor bottom-electrode thin films of each layer are electrically connected with a material that is selected from the group consisting of niobium, tin, lead and aluminum.

13. The process of claim 9, wherein the superconductor bottom-electrode thin films of each layer are made of niobium.

14. The process of claim 1, wherein the step of depositing a top superconductor electrode layer having a thickness greater than 50 nanometers is accomplished via sputtering.

* * * * *